United States Patent
He et al.

(10) Patent No.: US 10,581,222 B2
(45) Date of Patent: Mar. 3, 2020

(54) TUNABLE LASER AND CONTROL METHOD FOR SAME

(71) Applicant: HUAWEI TECHNOLOGIES CO., LTD., Shenzhen, Guangdong (CN)

(72) Inventors: Jifang He, Wuhan (CN); Hongmin Chen, Santa Clara, CA (US); Hongbing Lei, Santa Clara, CA (US); Xiao Andy Shen, Santa Clara, CA (US)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/034,471

(22) Filed: Jul. 13, 2018

(65) Prior Publication Data

US 2018/0323578 A1   Nov. 8, 2018

Related U.S. Application Data

(63) Continuation of application No. PCT/CN2017/070997, filed on Jan. 12, 2017.

(30) Foreign Application Priority Data

Jan. 15, 2016   (CN) .......................... 2016 1 0029003

(51) Int. Cl.
*H01S 3/13* (2006.01)
*H01S 5/0683* (2006.01)
(Continued)

(52) U.S. Cl.
CPC .......... *H01S 5/06835* (2013.01); *H01S 3/105* (2013.01); *H01S 5/0687* (2013.01);
(Continued)

(58) Field of Classification Search
CPC ............. H01S 5/06835; H01S 5/06256; H01S 5/0687; H01S 5/125; H01S 5/026;
(Continued)

(56) References Cited

U.S. PATENT DOCUMENTS 6,359,915 B1 * 3/2002 Koch .................. H01S 5/06256
                                                      372/102
6,658,028 B1 * 12/2003 Andersson ............ H01S 5/4006
                                                      372/18
(Continued)

FOREIGN PATENT DOCUMENTS

CN       1428018 A      7/2003
CN       1774845 A      5/2006
(Continued)

OTHER PUBLICATIONS

Extended European Search Report issued in European Application No. 17738171.2 dated Jan. 25, 2019, 9 pages.
(Continued)

*Primary Examiner* — Kinam Park
(74) *Attorney, Agent, or Firm* — Fish & Richardson P.C.

(57) ABSTRACT

A tunable laser is provided, including a first reflector, a second reflector, a phase adjustment area, a gain area, a first detector, a second detector, and a controller. The phase adjustment area is located between the first reflector and the gain area, the gain area is located between the phase adjustment area and the second reflector, a reflectivity of the first reflector is adjustable, and a reflectivity of the second reflector is adjustable. The first detector is configured to convert an optical signal of the first reflector into a first electrical signal. The second detector is configured to convert an optical signal of the second reflector into a second electrical signal. The controller is configured to adjust at least one of the reflectivity of the first reflector or the reflectivity of the second reflector based on the first electrical signal and the second electrical signal.

18 Claims, 6 Drawing Sheets

(51) Int. Cl.

| | |
|---|---|
| *H01S 3/105* | (2006.01) |
| *H01S 5/0687* | (2006.01) |
| *H01S 5/0625* | (2006.01) |
| *H01S 5/125* | (2006.01) |
| *H01S 5/026* | (2006.01) |
| *H01S 5/12* | (2006.01) |
| *H01S 5/06* | (2006.01) |
| *H01S 5/32* | (2006.01) |

(52) U.S. Cl.
CPC .......... *H01S 5/06256* (2013.01); *H01S 5/125* (2013.01); *H01S 5/026* (2013.01); *H01S 5/0261* (2013.01); *H01S 5/0264* (2013.01); *H01S 5/0612* (2013.01); *H01S 5/0617* (2013.01); *H01S 5/06837* (2013.01); *H01S 5/1209* (2013.01); *H01S 5/32* (2013.01); *H01S 2301/176* (2013.01)

(58) Field of Classification Search
CPC .... H01S 5/0261; H01S 5/0264; H01S 5/0612; H01S 5/0617; H01S 5/06837; H01S 5/1209; H01S 5/32; H01S 3/105
See application file for complete search history.

(56) References Cited

U.S. PATENT DOCUMENTS

| | | |
|---|---|---|
| 6,714,566 B1 | 3/2004 | Coldren et al. |
| 2002/0051472 A1* | 5/2002 | Morthier ............. H01S 5/06256 372/29.01 |
| 2002/0105990 A1 | 8/2002 | Fish et al. |
| 2002/0172237 A1* | 11/2002 | Murry ................ G02B 6/12007 372/18 |
| 2004/0076199 A1 | 4/2004 | Wipiejewski et al. |
| 2005/0025419 A1 | 2/2005 | Fish et al. |
| 2007/0041415 A1 | 2/2007 | Fujiwara et al. |
| 2009/0074020 A1 | 3/2009 | Matsui et al. |
| 2010/0189143 A1* | 7/2010 | Fukuda ................... H01S 5/026 372/20 |
| 2010/0260215 A1* | 10/2010 | Nguyen .............. H01S 5/06256 372/22 |
| 2011/0292953 A1* | 12/2011 | Liu ..................... H01S 5/06256 372/20 |
| 2012/0294628 A1 | 11/2012 | Ukita |
| 2013/0094527 A1 | 4/2013 | Fukuda et al. |
| 2015/0333475 A1 | 11/2015 | Blumenthal et al. |
| 2017/0195055 A1* | 7/2017 | Evans ................ H01S 5/02453 |

FOREIGN PATENT DOCUMENTS

| | | |
|---|---|---|
| CN | 101227061 A | 7/2008 |
| CN | 102074892 A | 5/2011 |
| CN | 102725926 A | 10/2012 |
| CN | 103066494 A | 4/2013 |

OTHER PUBLICATIONS

International Search Report and Written Opinion issued in International Application No. PCT/CN2017/070997 dated Mar. 30, 2017, 18 pages.
Office Action issued in Chinese Application No. 201610029003.7 dated Oct. 9, 2018, 4 pages.
Search Report issued in Chinese Application No. 201610029003.7 dated Sep. 25, 2018, 3 pages.

* cited by examiner

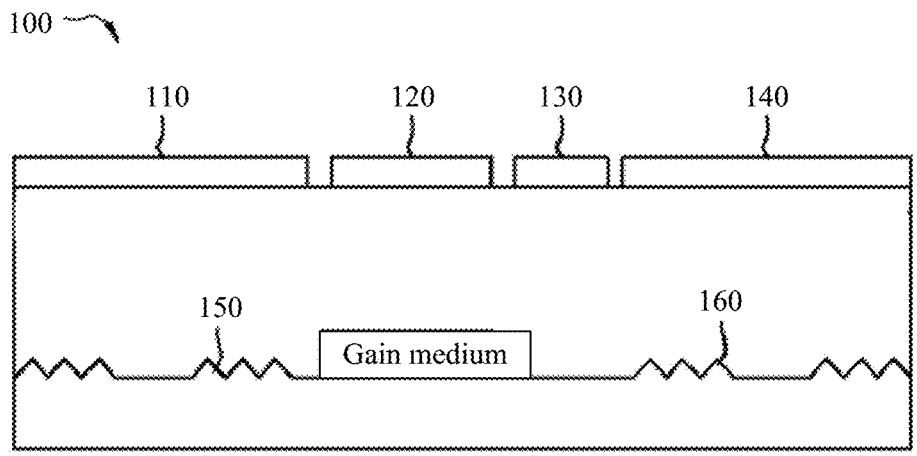
FIG. 1
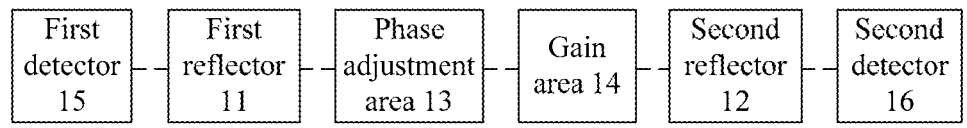
FIG. 2.1
FIG. 2.2

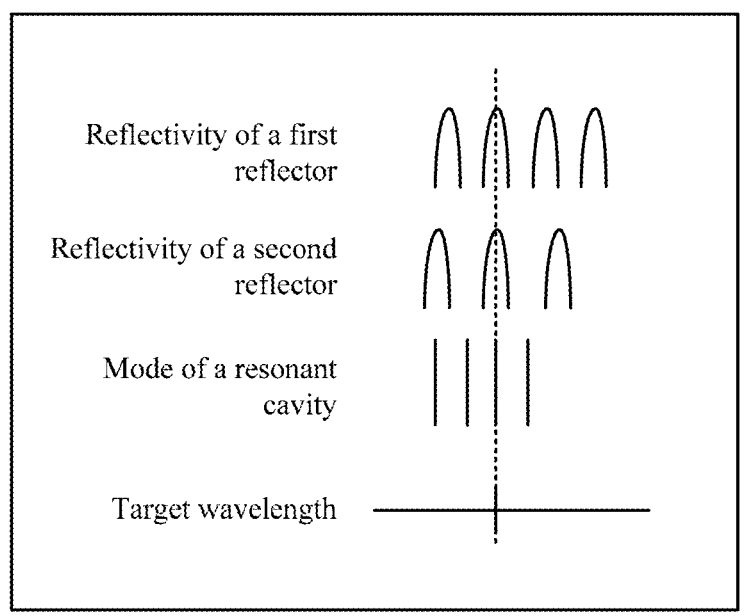
FIG. 2.3
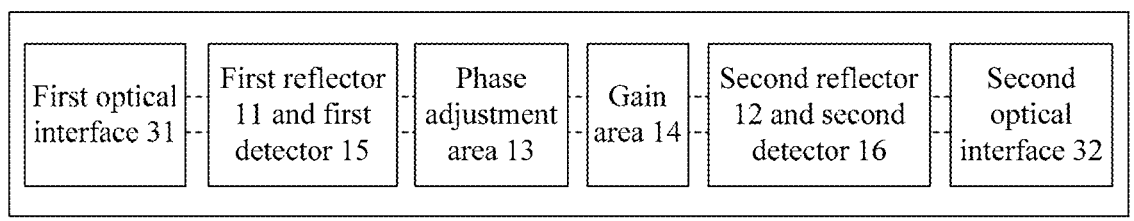
FIG. 3.1

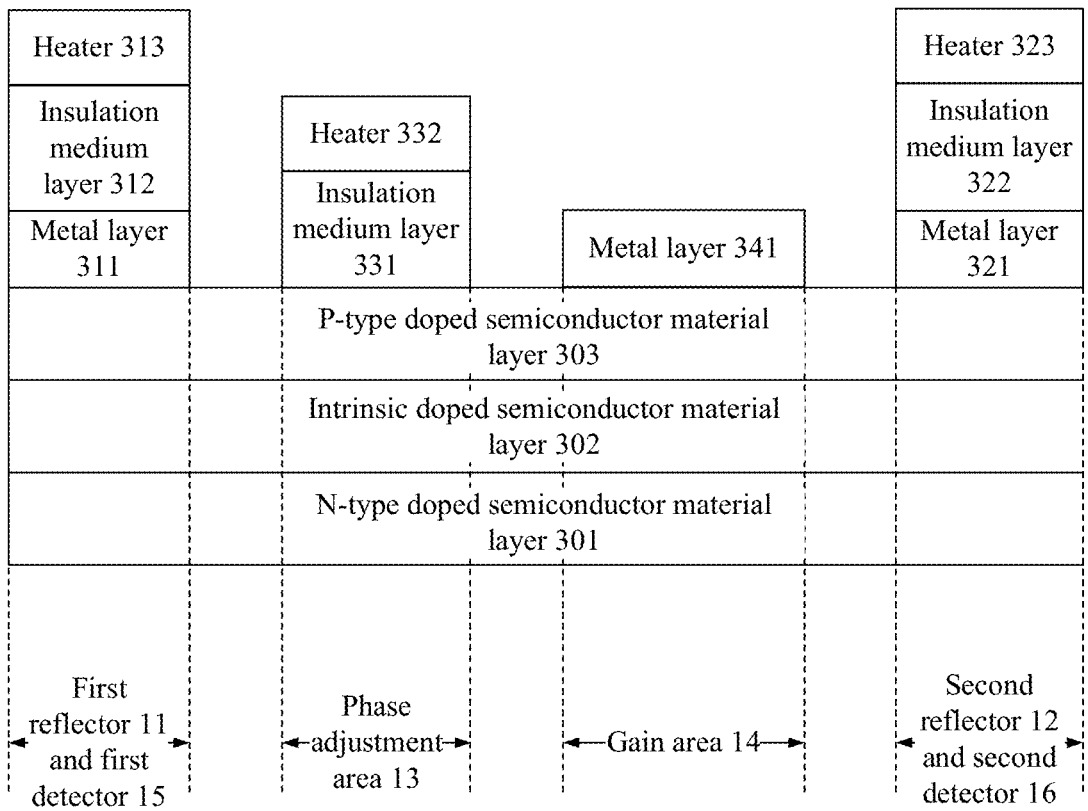
FIG. 3.2
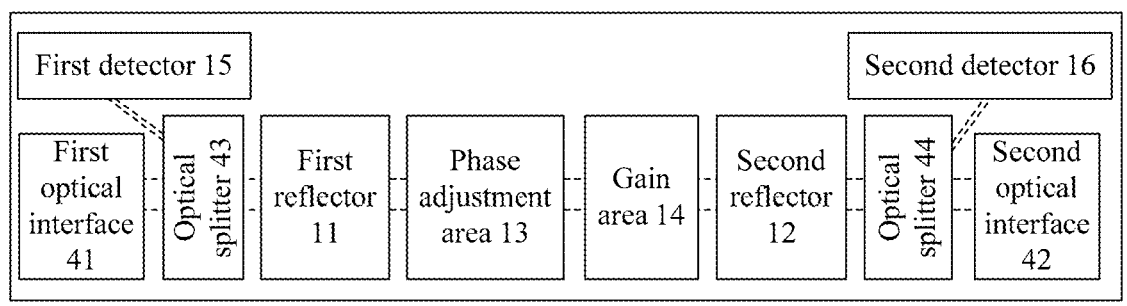
FIG. 4.1

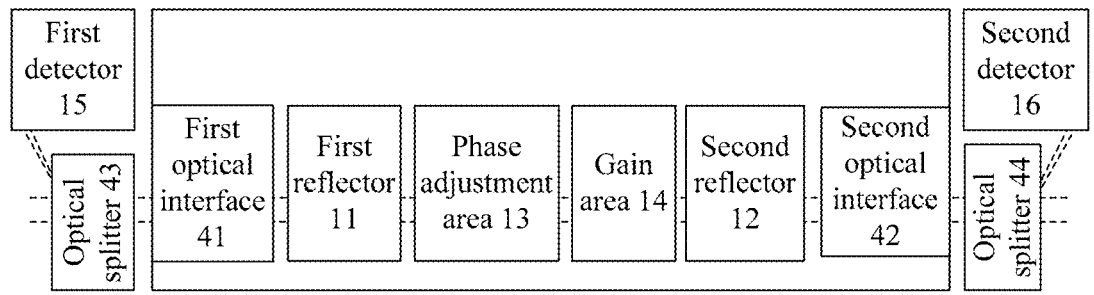
FIG. 4.2
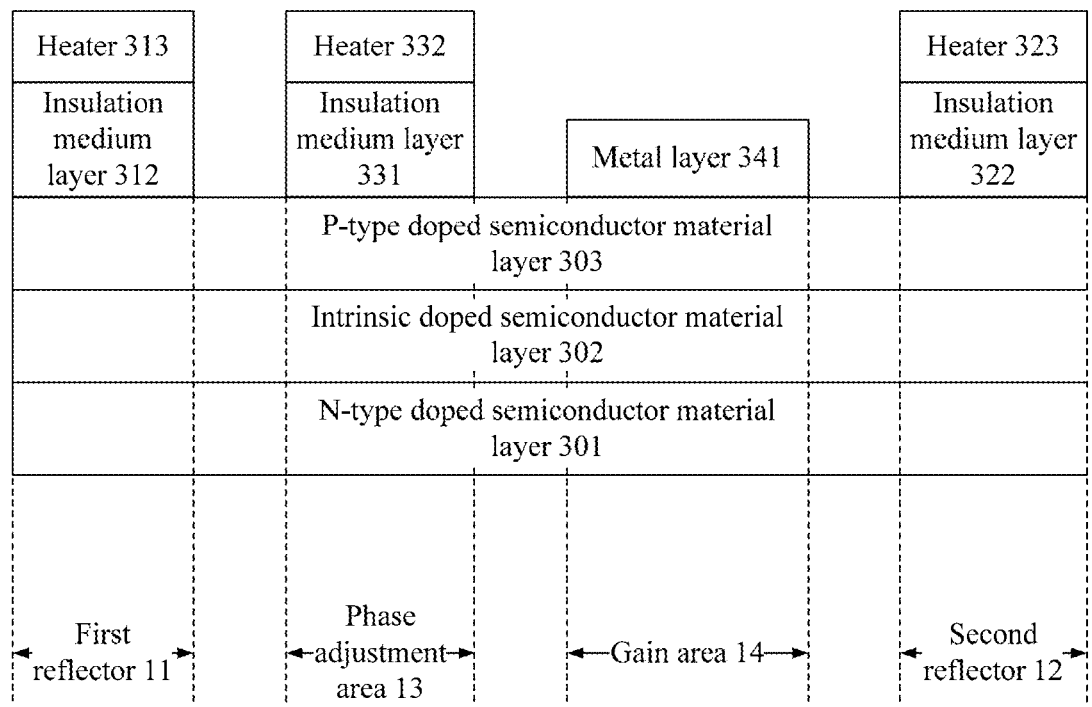
FIG. 4.3
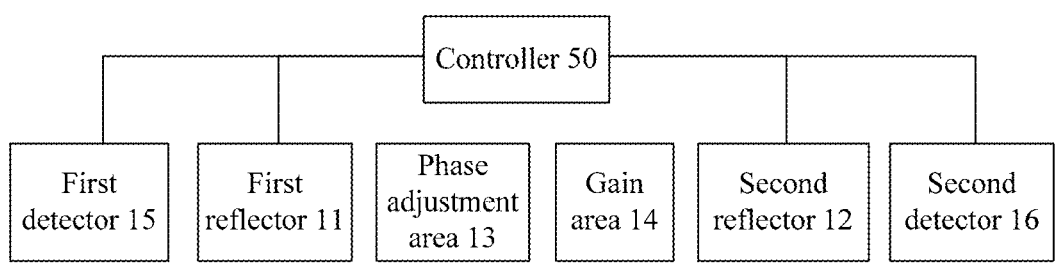
FIG. 5.1

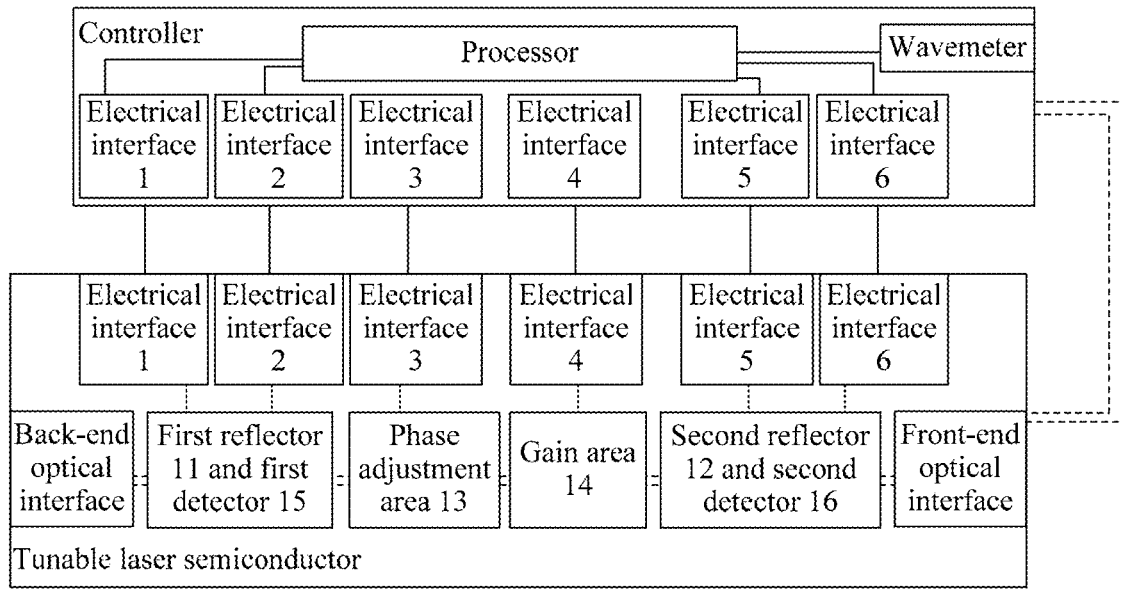
FIG. 5.2
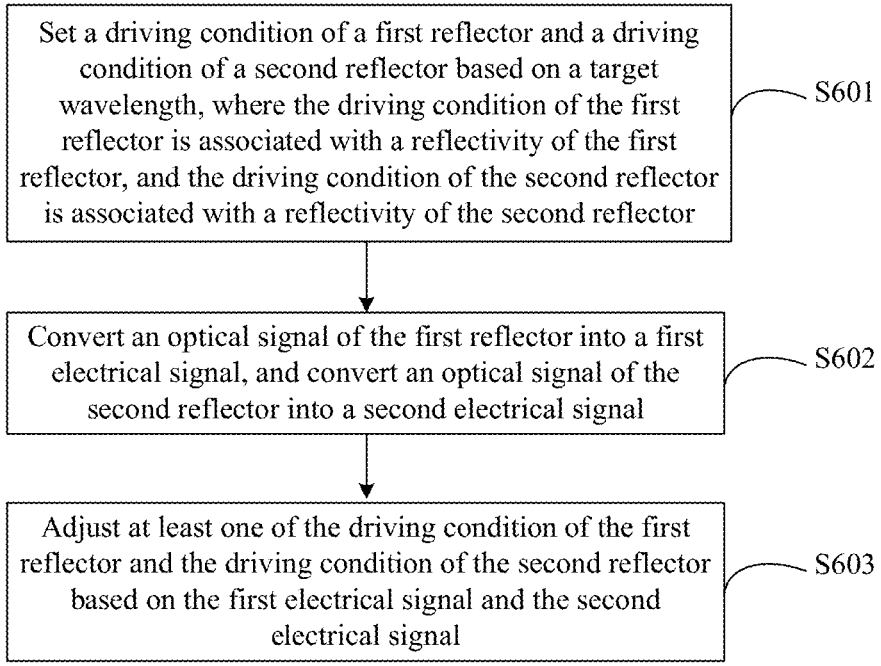
FIG. 6

TUNABLE LASER AND CONTROL METHOD FOR SAME

CROSS-REFERENCE TO RELATED APPLICATIONS

This application is a continuation of International Application No. PCT/CN2017/070997, filed on Jan. 12, 2017, which claims priority to Chinese Patent Application No. 201610029003.7, filed on Jan. 15, 2016. The disclosures of the aforementioned applications are hereby incorporated by reference in their entireties.

TECHNICAL FIELD

Embodiments of the present invention relate to the field of optoelectronic products, and in particular, to a tunable laser and a control method for same.

BACKGROUND

A tunable laser (TL) is a laser that can continuously change, in a particular range, a laser beam output wavelength. The tunable laser is mainly applied to coherent modulation optical transmission, and the coherent modulation optical transmission has become a mainstream solution for long-distance optical transmission at a rate of 100 G or higher. As technologies advance, a requirement for the tunable laser becomes higher. A tunable semiconductor laser based on a semiconductor technology has advantages of a small volume, high integration, and the like. The tunable semiconductor laser is a mainstream product in the tunable laser field.

In the prior art, a reflectivity of a reflector of a tunable semiconductor laser is adjustable. The reflectivity of the reflector may be changed by adjusting a driving condition of the reflector, and the driving condition of the reflector is fixedly set based on a target wavelength. However, as a service time or an operating environment changes, a relationship between the driving condition of the reflector and the reflectivity of the reflector may change, thereby resulting in performance deterioration of the tunable laser.

SUMMARY

Embodiments of the present invention provide a tunable laser and a control method for same, to resolve a problem of performance deterioration of the tunable laser in the prior art.

According to a first aspect, an embodiment of the present invention provides a tunable laser, including a first reflector, a second reflector, a phase adjustment area, a gain area, a first detector, a second detector, and a controller, where the phase adjustment area is located between the first reflector and the gain area, the gain area is located between the phase adjustment area and the second reflector, a reflectivity of the first reflector is adjustable, and a reflectivity of the second reflector is adjustable; the first detector is configured to convert an optical signal of the first reflector into a first electrical signal; the second detector is configured to convert an optical signal of the second reflector into a second electrical signal; and the controller is configured to adjust at least one of the reflectivity of the first reflector or the reflectivity of the second reflector based on the first electrical signal and the second electrical signal.

With reference to the first aspect, in a first possible implementation of the first aspect, the controller is specifically configured to adjust the at least one of the reflectivity of the first reflector or the reflectivity of the second reflector based on a result of comparison between the first electrical signal and the second electrical signal.

With reference to the first possible implementation of the first aspect, in a second possible implementation of the first aspect, the controller is specifically configured to adjust the at least one of the reflectivity of the first reflector or the reflectivity of the second reflector based on a ratio of a current value of the first electrical signal to a current value of the second electrical signal. A reflectivity of a reflector can be conveniently and quickly adjusted based on the current value ratio.

With reference to the first possible implementation of the first aspect, in a third possible implementation of the first aspect, the controller is specifically configured to adjust the at least one of the reflectivity of the first reflector or the reflectivity of the second reflector based on a ratio of a voltage value of the first electrical signal to a voltage value of the second electrical signal. A reflectivity of a reflector can be conveniently and quickly adjusted based on the voltage value ratio.

With reference to the first aspect, in a fourth possible implementation of the first aspect, the controller is further configured to control at least one of a phase of the phase adjustment area or a gain of the gain area. The phase of the phase adjustment area is controlled, so that a mode of a resonant cavity of the tunable laser can be aligned with a target wavelength. The gain of the gain area is controlled, so that strength of output light can be changed.

With reference to the first aspect, in a fifth possible implementation of the first aspect, the tunable laser is a tunable semiconductor laser, and the first reflector includes: an N-type doped semiconductor material layer; an intrinsic doped semiconductor material layer, located on the N-type doped semiconductor material layer; and a P-type doped semiconductor material layer, located on the intrinsic doped semiconductor material layer. The reflector that is implemented by using the N-type doped semiconductor material layer, the intrinsic doped semiconductor material layer, and the P-type doped semiconductor material layer has a simple structure and is easy to implement.

With reference to the fifth possible implementation of the first aspect, in a sixth possible implementation of the first aspect, the intrinsic doped semiconductor material layer includes a waveguide, and the P-type doped semiconductor material layer includes a grating structure. Optical transmission can be restricted by using the waveguide of the intrinsic doped semiconductor material layer. A reflection function of the reflector can be effectively implemented by using the grating structure of the P-type doped semiconductor material layer.

With reference to the first aspect or the fourth possible implementation of the first aspect, in a seventh possible implementation of the first aspect, the first detector includes: an N-type doped semiconductor material layer; an intrinsic doped semiconductor material layer, located on the N-type doped semiconductor material layer; a P-type doped semiconductor material layer, located on the intrinsic doped semiconductor material layer; and a metal layer, located on the P-type doped semiconductor material layer. The first detector converts an optical signal of the intrinsic doped semiconductor material layer into a first electrical signal of the metal layer. A photodiode can be constituted by using the N-type doped semiconductor material layer, the intrinsic doped semiconductor material layer, the P-type doped semiconductor material layer, and the metal layer. Therefore, the metal layer may be used to output the first electrical signal, so that a power of light transmitted on the intrinsic doped semiconductor material layer can be detected.

With reference to the seventh possible implementation of the first aspect, in an eighth possible implementation of the first aspect, the first reflector and the first detector share a same N-type doped semiconductor material layer, a same intrinsic doped semiconductor material layer, and a same P-type doped semiconductor material layer. The first reflector and the first detector share a same PN junction, and a process is simple, greatly reducing difficulty in a manufacturing process. In addition, a laser chip area is not increased, complying with a high integration trend of an optical device.

With reference to the eighth possible implementation of the first aspect, in a ninth possible implementation of the first aspect, the first reflector further includes an insulation medium layer and a heating layer, the insulation medium layer is located on the metal layer, the heating layer is located on the insulation medium layer, and the heating layer is configured to control the reflectivity of the first reflector. The reflectivity of the first reflector can be precisely controlled by using the heating layer. The insulation medium layer between the metal layer and the heating layer can effectively avoid signal crosstalk, ensuring stable operating of the detector.

With reference to the first aspect, in a tenth possible implementation of the first aspect, a first optical splitter is included between the first detector and the first reflector. Optical splitting is implemented by using an optical splitter, so that laser beam output by the first reflector may not be affected.

According to a second aspect, an embodiment of the present invention provides a control method for a tunable laser, including: setting a driving condition of a first reflector and a driving condition of a second reflector based on a target wavelength, where the driving condition of the first reflector is associated with a reflectivity of the first reflector, and the driving condition of the second reflector is associated with a reflectivity of the second reflector; converting an optical signal of the first reflector into a first electrical signal, and converting an optical signal of the second reflector into a second electrical signal; and adjusting at least one of the driving condition of the first reflector or the driving condition of the second reflector based on the first electrical signal and the second electrical signal.

With reference to the second aspect, in a first possible implementation of the second aspect, the adjusting at least one of the driving condition of the first reflector or the driving condition of the second reflector based on the first electrical signal and the second electrical signal specifically includes: adjusting the at least one of the driving condition of the first reflector or the driving condition of the second reflector based on a result of comparison between the first electrical signal and the second electrical signal.

With reference to the first possible implementation of the second aspect, in a second possible implementation of the second aspect, the adjusting the at least one of the driving condition of the first reflector or the driving condition of the second reflector based on a result of comparison between the first electrical signal and the second electrical signal specifically includes: adjusting the at least one of the driving condition of the first reflector or the driving condition of the second reflector based on a ratio of a current value of the first electrical signal to a current value of the second electrical signal. A reflectivity of a reflector can be conveniently and quickly adjusted based on the current value ratio.

With reference to the first possible implementation of the second aspect, in a third possible implementation of the second aspect, the adjusting the at least one of the driving condition of the first reflector or the driving condition of the second reflector based on a result of comparison between the first electrical signal and the second electrical signal specifically includes: adjusting the at least one of the driving condition of the first reflector or the driving condition of the second reflector based on a ratio of a voltage value of the first electrical signal to a voltage value of the second electrical signal. A reflectivity of a reflector can be conveniently and quickly adjusted based on the voltage value ratio.

With reference to the second aspect, in a fourth possible implementation of the second aspect, the method further includes: setting at least one of a gain or a phase of the tunable laser based on the target wavelength. The phase is controlled, so that a mode of a resonant cavity of the tunable laser can be aligned with the target wavelength. The gain is controlled, so that strength of output light can be changed.

The tunable laser provided in the embodiments of the present invention includes the first detector, the second detector, and the controller, where the first detector is configured to convert the optical signal of the first reflector into the first electrical signal; the second detector is configured to convert the optical signal of the second reflector into the second electrical signal; and the controller is configured to adjust the at least one of the reflectivity of the first reflector or the reflectivity of the second reflector based on the first electrical signal and the second electrical signal. The reflectivity of the first reflector and the reflectivity of the second reflector can be adjusted by using the first electrical signal and the second electrical signal, so that performance deterioration of the tunable laser can be prevented.

BRIEF DESCRIPTION OF DRAWINGS

To describe the technical solutions in the embodiments of the present invention more clearly, the following briefly describes the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

FIG. 1 is a schematic diagram of a tunable laser according to an embodiment of the present invention;

FIG. 2.1 is a schematic structural diagram of a tunable laser according to an embodiment of the present invention;

FIG. 2.2 is a schematic diagram in which reflection peaks of a first reflector and a second reflector vary with a driving power according to an embodiment of the present invention;

FIG. 2.3 is a schematic diagram of alignment of a reflection peak of a first reflector, a reflection peak of a second reflector, and a mode of a resonant cavity with a target wavelength according to an embodiment of the present invention;

FIG. 3.1 is a schematic structural diagram of another tunable laser according to an embodiment of the present invention;

FIG. 3.2 is a sectional drawing of a tunable laser according to an embodiment of the present invention;

FIG. 4.1 is a schematic structural diagram of still another tunable laser according to an embodiment of the present invention;

FIG. 4.2 is a schematic structural diagram of yet another tunable laser according to an embodiment of the present invention;

FIG. 4.3 is a sectional drawing of another tunable laser according to an embodiment of the present invention;

FIG. 5.1 is a schematic structural diagram of still yet another tunable laser according to an embodiment of the present invention;

FIG. 5.2 is a schematic structural diagram of a further tunable laser according to an embodiment of the present invention;

FIG. 6 is a flowchart of a control method for a tunable laser according to an embodiment of the present invention.

DESCRIPTION OF EMBODIMENTS

Figure 7:
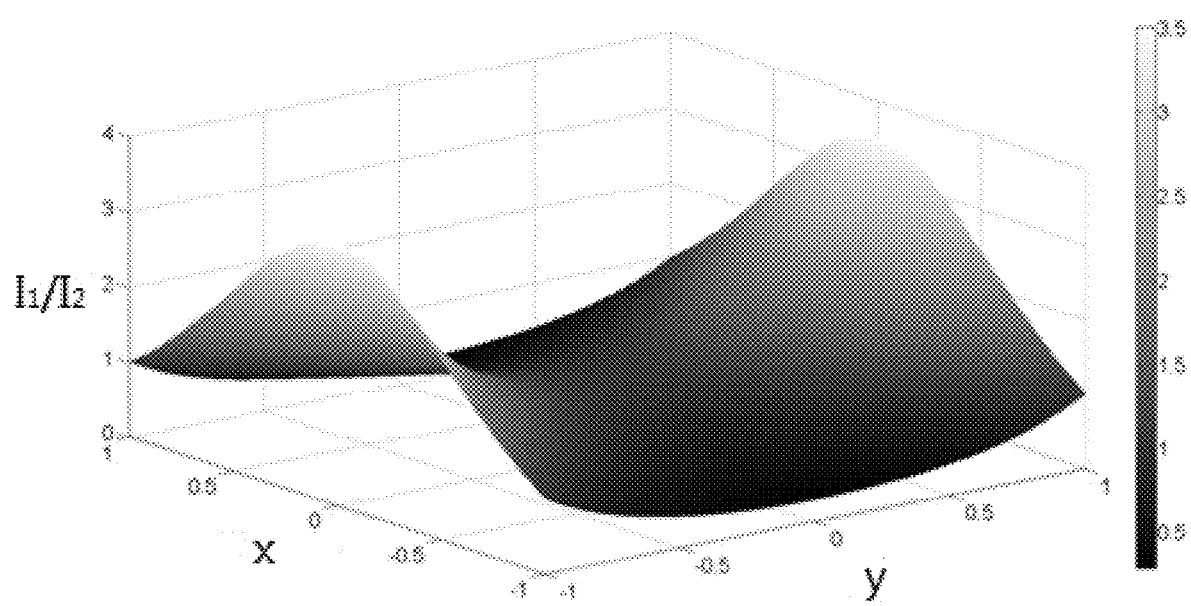
FIG. 7 is a diagram of a relationship between a current ratio of a tunable laser and a driving condition of the tunable laser according to an embodiment of the present invention.

The following clearly describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present invention.

Three conditions for generating a laser beam are: achieving a population inversion, meeting a threshold condition, and meeting a resonance condition. A primary condition for generating a laser beam is a population inversion. That is, in a semiconductor, an electron in a valence band needs to be pumped to a conduction band. In order to achieve a population inversion, heavily doped P-type and N-type materials are usually used, to constitute a PN junction. In this case, with an external voltage applied, a population inversion occurs near a junction area. Electrons are stored at a high Fermi energy level, and holes are stored at a low Fermi energy level. Certainly, there are also many other methods for achieving a population inversion. Achieving a population inversion is a necessary condition, instead of a sufficient condition, for generating a laser beam. A resonant cavity with an extremely small loss is further needed for generating a laser beam. A main part of the resonant cavity is two mutually parallel reflectors. Simulated emission light is reflected back and forth between the two reflectors, and new simulated emission is continuously caused, so that the simulated emission light is continuously amplified. Enhanced interference can be generated at an output end and a stable laser beam is output, only when a gain obtained through amplification by stimulated emission is greater than various losses inside a laser, that is, a particular threshold condition is satisfied. The resonance condition means that, after a length L of the resonant cavity and a reflectivity N of the resonant cavity are determined, only light at a particular frequency can form oscillation and a stable laser beam is output. This indicates that the resonant cavity has a particular frequency selection function for an output laser beam.

A distributed Bragg reflection (DBR) tunable laser is usually constituted by junction of a gain area and a passive area on an indium phosphide (InP) substrate. A band gap of the gain area is relatively low, and when electricity injection is performed, electrical energy is converted into optical energy, thereby providing a gain. A band gap of the passive area is higher than photon energy of a laser beam wavelength, and a small quantity of laser beams are absorbed. Therefore, a very low absorption loss can be provided. Structurally, the passive area mainly includes a reflector and an optical waveguide. To cover an entire C band (a range of approximately 35 nm), usually a reflection cavity is constituted by using a "vernier effect" between two reflectors. The two reflectors each have a comb reflection spectrum and a plurality of reflection peaks, and the reflection peak is adjustable. When the reflection peaks of the two reflectors are aligned with a target wavelength at the same time, a reflectivity of the target wavelength in the reflection cavity is the highest. Because the two reflectors are usually located before and after the gain area, and are usually referred to as a front reflector (FM) and a back reflector (BM), respectively. A distributed Bragg reflection reflector (DBR reflector) is a most typical comb reflector. In addition, a passive area may further include a phase adjustment area (PH) configured to perform fine adjustment on a valid optical path in a resonant cavity, so as to change an output wavelength of the laser. FIG. 1 is a schematic diagram of a DBR tunable laser 100. The DBR tunable laser 100 includes an FM 110, a gain section 120, a phase or passive section 130, and a BM 140. The FM 110 and the BM 140 may both have a sampling grating 150 and a sampling grating 160 that have comb reflection spectrums but different comb spacings. The gratings are fabricated in a semiconductor material under the FM 110 and the BM 140, and a waveguide is fabricated between the grating of the FM 110 and the grating of the BM 140 for optical transmission. Usually, the gratings and the waveguide can be fabricated on an intrinsic doped semiconductor material layer. A grating may be an optical component having a periodic structure that splits and diffracts light into different beams proceeding in different directions. The sampling gratings may be gratings of which a grating element is removed periodically. A component of the laser 100 may define a cavity. The gain section 120 may generate light, and a particular wavelength can oscillate in the cavity and another wavelength may be suppressed. Finally, the laser 100 can emit a laser beam from the left side of the laser 100 along the plane of the page.

An embodiment of the present invention provides a tunable laser, including two reflectors. The two reflectors are located on two sides of the tunable laser to constitute a resonant cavity, so as to meet a threshold condition. A gain area is included between the two reflectors, and the gain area can implement a population inversion. A phase adjustment area is further included between the two reflectors, and the phase adjustment area can change a resonance condition of the tunable laser, to change a wavelength of output light of the tunable laser, thereby outputting a laser beam of a target wavelength. In addition, a reflectivity of the reflector of the tunable laser in this embodiment of the present invention is adjustable. In different driving conditions, the reflectivity of the reflector varies with laser beams of different wavelengths. If a peak of the reflectivity of the reflector is aligned with the target wavelength, a laser beam of the target wavelength in the resonant cavity may easily meet the threshold condition and performance of the output laser beam is relatively high. If a peak of the reflectivity of the reflector is not aligned with the target wavelength, a reflectivity of light of another wavelength is relatively large. This is equivalent to an increase of noise, an increase of a linewidth of the laser, and a decrease of a side mode suppression ratio of the laser.

As a service time or an operating environment changes, a relationship between a driving condition of the reflector and the reflectivity of the reflector may change. If the driving condition of the reflector is still fixedly set based on the target wavelength, a reflectivity of light of another wavelength is larger than a reflectivity of light of the target wavelength. This is equivalent to an increase of noise, an increase of a linewidth of the laser, and a decrease of a side mode suppression ratio of the laser. Therefore, in a product manual of the laser, technical specifications such as the linewidth and the side mode suppression ratio of the laser are subject to performance that is at a last stage of a service lifetime or in a bad operating environment. The performance is poorer than performance that is at an early stage of the service lifetime or in a good operating environment. Therefore, this means that authenticity of technical specifications of a product is ensured by sacrificing performance of the product.

The tunable laser provided in this embodiment of the present invention further includes a first detector, a second detector, and a controller. The first detector is configured to convert an optical signal of a first reflector into a first electrical signal. The second detector is configured to convert an optical signal of a second reflector into a second electrical signal. The controller is configured to adjust at least one of a reflectivity of the first reflector or a reflectivity of the second reflector based on the first electrical signal and the second electrical signal.

A tunable semiconductor laser is used as an example to describe a driving condition of a reflector. A reflectivity of the reflector of the tunable semiconductor laser is adjustable. The reflectivity of the reflector may be changed by adjusting the driving condition of the reflector. A wavelength of a laser beam that is output by the tunable semiconductor laser is associated with the reflectivity of the reflector, the reflectivity of the reflector is associated with a refractive index of the reflector, and the refractive index of the reflector may be adjusted by adjusting carrier density of the reflector or adjusting a temperature of the reflector. If the reflectivity of the reflector is changed by adjusting the carrier density of the reflector, an electron may be injected into the reflector, thereby changing the carrier density of the reflector. In this manner, the driving condition of the reflector may be an injection current or voltage of the reflector. If the reflectivity of the reflector is changed by adjusting the temperature of the reflector, a heater (resistor) may be used to adjust the temperature of the reflector. In this manner, the driving condition of the reflector may be a current, a voltage, a power, or the like of the heater.

FIG. 2.1 is a schematic structural diagram of a tunable laser according to an embodiment of the present invention. The tunable laser includes a first reflector 11, a second reflector 12, a phase adjustment area 13, a gain area 14, a first detector 15, and a second detector 16.

The phase adjustment area 13 is located between the first reflector 11 and the gain area 14, and a reflectivity of the first reflector is adjustable.

The gain area 14 is located between the phase adjustment area 13 and the second reflector 12, and a reflectivity of the second reflector is adjustable.

The first detector is configured to convert an optical signal of the first reflector into a first electrical signal.

The second detector is configured to convert an optical signal of the second reflector into a second electrical signal.

The reflectivity of the first reflector or the reflectivity of the second reflector or both in this embodiment of the present invention are adjustable. For example, the first reflector and the second reflector are comb reflectors. A comb reflection spectrum of a comb reflector has a plurality of reflection peaks, and locations of the reflection peaks vary with a driving condition of the comb reflector. FIG. 2.2 is a schematic diagram in which reflection peaks of the first reflector and the second reflector vary with a driving power, where the hollow-circle line indicates a curve of changes in the reflection peaks of the first reflector with the driving power, and the solid-circle line indicates a curve of changes in the reflection peaks of the second reflector with the driving power. When driving conditions of the first reflector and the second reflector are adjusted so that the reflection peak of the first reflector and the reflection peak of the second reflector are both aligned with a target wavelength, a reflectivity of light of the target wavelength is the highest in a resonant cavity of the tunable laser.

The driving condition of the comb reflector may be electric injection adjustment or another adjustment manner such as heat adjustment. Heat adjustment is used as an example. A temperature of the first reflector may be changed by changing a heating electric power of the first reflector, so that a location of the reflection peak of the first reflector may be changed.

A desirable operating point of the tunable laser is that the reflection peak of the first reflector, the reflection peak of the second reflector, and a mode of the resonant cavity are all in accordance with the target wavelength. In this case, performance, such as a linewidth and a side mode suppression ratio (SMSR), of an output laser beam of the tunable laser is high. FIG. 2.3 is a schematic diagram of alignment of a reflection peak of a first reflector, a reflection peak of a second reflector, and a mode of a resonant cavity with a target wavelength according to an embodiment of the present invention.

The reflection peak of the first reflector and the reflection peak of the second reflector in this embodiment of the present invention may be changed by adjusting driving conditions of the first reflector and the second reflector, and the mode of the resonant cavity may be changed by adjusting a phase adjustment area. As a service time or an operating environment changes, a relationship between a driving condition of a reflector and a reflectivity of the reflector may change, thereby resulting in performance deterioration of a tunable laser. The tunable laser in this embodiment of the present invention further includes a first detector and a second detector. The first detector converts an optical signal of the first reflector into a first electrical signal, and the second detector converts an optical signal of the second reflector into a second electrical signal. Therefore, at least one of a reflectivity of the first reflector or a reflectivity of the second reflector may be adjusted based on the first electrical signal and the second electrical signal, for example, adjustment may be performed by using a controller. An optical signal of a reflector may be an optical signal at an output end of the reflector or may be a part of a signal coupled from an optical signal that is output from the output end. If the reflector is a reflector of a semiconductor structure, for example, a reflector constituted by using an N-type doped semiconductor material layer, an intrinsic doped semiconductor material layer, and a P-type doped semiconductor material layer, an optical signal of the reflector may also be an optical signal of light that is transmitted on the intrinsic doped semiconductor material layer.

The following provides several embodiments to describe the tunable laser in detail. FIG. 3.1 is another schematic structural diagram of a tunable laser. The tunable laser is a tunable semiconductor laser, where a first reflector 11, a second reflector 12, a phase adjustment area 13, a gain area 14, a first detector 15, and a second detector 16 are integrated on a semiconductor chip. The first reflector 11 and the first detector 15 are fabricated together and are connected to the phase adjustment area 13 through an optical waveguide. The phase adjustment area 13 is connected to the gain area 14 through an optical waveguide. The gain area 14 is connected to the second reflector 12 through an optical waveguide. The second reflector 12 and the second detector 16 are fabricated together. The first detector 15 and the second detector 16 do not additionally increase a chip area. A first optical interface 31 is further included at an end that is far from the gain area and on the first reflector, and a second optical interface 32 is further included at an end that is far from the gain area and on the second reflector. The first optical interface 31 and the second optical interface 32 are configured to output laser beams on two sides. Certainly, in actual application, one of the optical interfaces may be disabled selectively by using a method such as adding an absorption area or coating, and only one optical output interface is retained. If the second optical interface is selected to output light, the second reflector may also be referred to as a front reflector and the first reflector may also be referred to as a back reflector.

In this embodiment of the present invention, a semiconductor amplifier may further be disposed between a reflector and an optical interface to amplify an optical signal that is output from the reflector. For example, if the second optical interface 32 is set as an interface that outputs light and the first optical interface 31 is set as an interface that does not output light, a semiconductor amplifier may be disposed between the second reflector 12 and the second optical interface 32, and by using a method such as adding an absorption area or coating at the first reflector 11 or the first optical interface 31, intensity of light that is output from the first optical interface 31 is reduced or even almost no light is output.

FIG. 3.2 is a sectional drawing of a tunable laser according to an embodiment of the present invention, and corresponds to a middle part of FIG. 3.1. In this embodiment, a first reflector 11, a second reflector 12, a phase adjustment area 13, a gain area 14, a first detector 15, and a second detector 16 each include an N-type doped semiconductor material layer 301, an intrinsic doped semiconductor material layer 302, and a P-type doped semiconductor material layer 303. The intrinsic doped semiconductor material layer 302 is located on the N-type doped semiconductor material layer 301, and the P-type doped semiconductor material layer 303 is located on the intrinsic semiconductor material layer 302. The N-type doped semiconductor material layer 301 may also be referred to as a lower cladding layer, and its doped material may be InP. The intrinsic doped semiconductor material layer 302 may also be referred to as an active layer, and its doped material may be indium gallium arsenide phosphide (InGaAsP). The intrinsic doped semiconductor material layer of the gain area 14 may include a plurality of quantum wells, and an emission wavelength of the quantum well can cover an operating wavelength range of the laser. The P-type doped semiconductor material layer 303 may also be referred to as an upper cladding layer. Refractive indexes of the P-type doped semiconductor material layer 303 and the N-type doped semiconductor material layer 301 are lower than a refractive index of the intrinsic doped semiconductor material layer 302, and light can be controlled to be transmitted within the intrinsic doped semiconductor material layer. A band gap of the gain area 14 is lower than photon energy of a target output wavelength of the laser, and when electric injection is performed, electrical energy is converted into optical energy, thereby providing a gain. A band gap of a passive area is higher than the photon energy of the target output wavelength of the laser, and a small quantity of laser beams are absorbed. Therefore, a very low absorption loss can be provided. Structurally, the passive area mainly includes the first reflector 11, the second reflector 12, the phase adjustment area 13, and the like.

In this embodiment, the first reflector 11 and the first detector 15 share a same N-type doped semiconductor material layer, a same intrinsic doped semiconductor material layer, and a same P-type doped semiconductor material layer. The first detector 15 further includes a metal layer 311. The metal layer 311 is located on the P-type doped semiconductor material layer 303. The metal layer is used as an electrode contact layer of a P-i-N photodiode constituted by P-InP/i-InGaAsP/N-InP in this area, and is configured to provide a bias voltage for the P-i-N or collect a photocurrent signal. By using the metal layer, a reverse bias voltage is provided for the P-i-N photodiode constituted by the P-InP/i-InGaAsP/N-InP. After light passing through an i-InGaAsP area is absorbed, a photocurrent is generated. The photocurrent is output through the metal layer, and therefore an optical signal of the first reflector 11 may be converted into a first electrical signal. That is, the first detector converts an optical signal of the intrinsic doped semiconductor material layer into a first electrical signal of the metal layer. In addition, a heavy P-type doped semiconductor material layer may be added between the metal layer 311 and the P-type doped semiconductor material layer 303. In this case, ohmic contact connection of the metal layer 311 may be improved.

In this embodiment, the first reflector 11 further includes an insulation medium layer 312 and a heating layer 313. The insulation medium layer 312 is located on the metal layer 311, the heating layer 313 is located on the insulation medium layer 312, and the heating layer is configured to control a reflectivity of the first reflector. The insulation medium layer is configured to isolate signal crosstalk between the metal layer and the heating layer. The heating layer may be a resistor. A current is applied to the resistor, to change a temperature of the resistor, a temperature of the first reflector, and the reflectivity of the first reflector, and therefore a reflection peak wavelength of the first reflector is also changed. The intrinsic doped semiconductor material layer corresponding to the first reflector 11 may include a waveguide, configured to restrict optical transmission. The P-type doped semiconductor material layer corresponding to the first reflector 11 may include a grating structure, configured to generate a comb reflection spectrum.

In this embodiment, the second reflector 12 and the second detector 16 share a same N-type doped semiconductor material layer, a same intrinsic doped semiconductor material layer, and a same P-type doped semiconductor material layer. The second detector 16 further includes a metal layer 321. The metal layer 321 is located on the P-type doped semiconductor material layer 303. The metal layer is used as an electrode contact layer of a P-i-N photodiode constituted by P-InP/i-InGaAsP/N-InP in this area, and is configured to provide a bias voltage for the P-i-N or collect a photocurrent signal. By using the metal layer, a reverse bias voltage is provided for the P-i-N photodiode constituted by the P-InP/i-InGaAsP/N-InP. After light passing through an i-InGaAsP area is absorbed, a photocurrent is generated. The photocurrent is output through the metal layer, and therefore it may be detected that an optical signal of the second reflector 12 is converted into a second electrical signal. That is, the second detector converts an optical signal of the intrinsic doped semiconductor material layer into a second electrical signal of the metal layer.

In this embodiment, the second reflector 12 further includes an insulation medium layer 322 and a heating layer 323. The insulation medium layer 322 is located on the metal layer 321, the heating layer 323 is located on the insulation medium layer 322, and the heating layer is configured to control a reflectivity of the second reflector. The insulation medium layer is configured to isolate signal crosstalk between the metal layer and the heating layer. The heating layer may be a resistor. A current is applied to the resistor, to change a temperature of the resistor, a temperature of the second reflector, and the reflectivity of the second reflector, and therefore a reflection peak wavelength of the second reflector is also changed. The intrinsic doped semiconductor material layer corresponding to the second reflector 12 may include a waveguide, configured to restrict optical transmission. The P-type doped semiconductor material layer corresponding to the second reflector 12 may include a grating structure, configured to generate a comb reflection spectrum.

In this embodiment, the phase adjustment area 13 further includes an insulation medium layer 331 and a heating layer 332. The insulation medium layer 331 is located on the P-type doped semiconductor material layer 303, the heating layer 332 is located on the insulation medium layer 331, and the heating layer 332 adjusts a mode of a resonant cavity by controlling a temperature.

In this embodiment, the gain area 14 further includes a metal layer 341. The metal layer 341 is located on the P-type doped semiconductor material layer 303, and the metal layer 341 is configured to provide an injection current required by the gain area.

FIG. 4.1 is a schematic structural diagram of still another tunable laser according to an embodiment of the present invention. A first reflector 11, a second reflector 12, a phase adjustment area 13, a gain area 14, a first detector 15, and a second detector 16 are integrated on a semiconductor chip. In comparison with the tunable laser provided in FIG. 3.1, the first detector and the first reflector are independent of each other. Light of the first reflector passes through an optical splitter 43. A proportion of the light enters the first detector 15 for optical-to-electrical conversion, and remaining light is output through a first optical interface 41. The optical splitter 43 herein may be a directional coupling waveguide or may be another integratable component that has an optical splitting function. Similarly, the second detector and the second reflector are independent of each other, and have a similar structure. Details are not described herein again.

FIG. 4.2 is a schematic structural diagram of yet another tunable laser according to an embodiment of the present invention. A first reflector 11, a second reflector 12, a phase adjustment area 13, and a gain area 14 are integrated on a semiconductor chip. In comparison with the tunable laser provided in FIG. 4.1, light that is output from a first optical interface 41 passes through an optical splitter 43, and a proportion of the light enters a first detector 15 for optical-to-electrical conversion. Similarly, a second detector and the second reflector are independent of each other, and have a similar structure. Details are not described herein again.

FIG. 4.3 is a sectional drawing of a tunable laser according to an embodiment of the present invention, and corresponds to middle parts of FIG. 4.1 and FIG. 4.2. In comparison with the tunable laser provided in FIG. 3.2, neither a first reflector part nor a second reflector part includes a metal layer because a first detector and a first reflector are independent of each other in this embodiment.

FIG. 5.1 is a schematic structural diagram of still yet another tunable laser according to an embodiment of the present invention. The tunable laser includes a first reflector 11, a second reflector 12, a phase adjustment area 13, a gain area 14, a first detector 15, and a second detector 16. In comparison with the tunable laser provided in FIG. 1, the tunable laser provided in FIG. 5.1 further includes a controller 50. The controller 50 is configured to adjust a reflectivity of the first reflector 11 and/or a reflectivity of the second reflector 12 based on a first electrical signal and a second electrical signal. Specifically, the controller 50 may receive a current value of the first electrical signal from the first detector 15, receive a current value of the second electrical signal from the second detector 16, and adjust at least one of the reflectivity of the first reflector or the reflectivity of the second reflector based on a ratio of the current value of the first electrical signal to the current value of the second electrical signal. The controller 50 may alternatively receive a voltage value of the first electrical signal from the first detector 15, receive a voltage value of the second electrical signal from the second detector 16, and adjust at least one of the reflectivity of the first reflector or the reflectivity of the second reflector based on a ratio of the voltage value of the first electrical signal to the voltage value of the second electrical signal. Certainly, the controller may alternatively use another physical quantity of the first electrical signal and the second electrical signal to adjust a reflectivity of a reflector, provided that the physical quantity can represent an optical power of an optical signal of the reflector.

In addition, the controller 50 can further control a phase of the phase adjustment area, a gain of the gain area, and the like.

FIG. 5.2 is a schematic structural diagram of a further tunable laser according to an embodiment of the present invention, and corresponds to the tunable laser provided in FIG. 3.1. A first reflector 11, a second reflector 12, a phase adjustment area 13, a gain area 14, a first detector 15, a second detector 16, and the like provided in this embodiment are integrated on a first chip, and a controller is integrated on a second chip. The first chip and the second chip are connected through their respective electrical interfaces and optical interfaces. An electrical interface 1 of the first chip is connected to a heating layer of the first reflector and is configured to control a reflectivity of the first reflector. An electrical interface 2 of the first chip is connected to a metal layer of the first detector and is configured to output a first electrical signal. An electrical interface 3 of the first chip is connected to a heating layer of the phase adjustment area and is configured to control a cavity membrane of a resonant cavity. An electrical interface 4 of the first chip is connected to a metal layer of the gain area and is configured to provide a gain. An electrical interface 5 of the first chip is connected to a heating layer of the second reflector and is configured to control a reflectivity of the second reflector. An electrical interface 6 of the first chip is connected to a metal layer of the second detector and is configured to output a second electrical signal. Electrical interfaces 1 to 6 of the second chip correspond to the electrical interfaces 1 to 6 of the first chip. A wavemeter of the second chip may receive output light of a second optical interface and detect a wavelength of the output light.

FIG. 6 is a flowchart of a control method for a tunable laser according to an embodiment of the present invention. The method includes the following steps:

S601: Set a driving condition of a first reflector and a driving condition of a second reflector based on a target wavelength, where the driving condition of the first reflector is associated with a reflectivity of the first reflector, and the driving condition of the second reflector is associated with a reflectivity of the second reflector.

S602: Convert an optical signal of the first reflector into a first electrical signal, and convert an optical signal of the second reflector into a second electrical signal.

S603: Adjust at least one of the driving condition of the first reflector or the driving condition of the second reflector based on the first electrical signal and the second electrical signal.

S603 may specifically include: adjusting the at least one of the driving condition of the first reflector or the driving condition of the second reflector based on a result of comparison between the first electrical signal and the second electrical signal. S603 may more specifically include: adjusting the at least one of the driving condition of the first reflector or the driving condition of the second reflector based on a ratio of a current value of the first electrical signal to a current value of the second electrical signal. Alternatively, S603 may more specifically include: adjusting the at least one of the driving condition of the first reflector or the driving condition of the second reflector based on a ratio of a voltage value of the first electrical signal to a voltage value of the second electrical signal.

In addition, a gain and a phase of the tunable laser may further be set based on the target wavelength.

The following describes in detail the adjusting at least one of the driving condition of the first reflector or the driving condition of the second reflector based on the first electrical signal and the second electrical signal.

First, a ratio $P_1/P_2$ of an optical power $P_1$ of the first reflector to an optical power $P_2$ of the second reflector has a relationship with a reflectivity. Based on a laser beam principle, for a tunable laser, the ratio $P_1/P_2$ of the optical power $P_1$ of the first reflector to the optical power $P_2$ of the second reflector is $t_1^2 * r_2 / t_2^2 * r_1$, where $r_1$ is a reflectivity of an end face of a reflector 1, $t_1$ is a transmittance of the end face of the reflector 1, $r_2$ is a reflectivity of an end face of a reflector 2, and $t_2$ is a transmittance of the end face of the reflector 2. For a thermally-tuned tunable laser, the foregoing formula may be properly simplified as follows: A reflector does not have an absorption loss, and then: $t_1^2 + r_1^2 = 1$, and $t_2^2 + r_2^2 = 1$. In this way, $P_1/P_2$ may be simplified to $(1/r_1 - r_1)/(1/r_2 - r_2)$. $r_1$ and $r_2$ are both greater than 0 and less than 1. Therefore, when $r_1$ is fixed and $r_2$ is changed, a value of $P_1/P_2$ may reach a maximum value as $r_2$ increases; when $r_2$ is fixed and $r_1$ is changed, a value of $P_1/P_2$ may reach a minimum value as $r_1$ increases. Changing processes of $r_1$ and $r_2$ are processes of adjusting a reflector. If both the first reflector and the second reflector are aligned with the target wavelength, $r_1$ and $r_2$ reach maximum values at the same time.

For the converting an optical signal of the first reflector into a first electrical signal, and converting an optical signal of the second reflector into a second electrical signal, the ratio of the current value $I_1$ of the first electrical signal to the current value $I_2$ of the second electrical signal is proportional to a ratio of an optical power $P_1$ of the optical signal of the first reflector to an optical power $P_2$ of the optical signal of the second reflector, namely, $I_1/I_2 = A * P_1/P_2 = A * (1/r_1 - r_1)/(1/r_2 - r_2)$, where A is a constant greater than 0. That is, at least one of the reflectivity of the first reflector or the reflectivity of the second reflector may be adjusted based on the ratio of the current value of the first electrical signal to the current value of the second electrical signal. Certainly, the ratio of the voltage value $V_1$ of the first electrical signal to the voltage value $V_2$ of the second electrical signal may also be proportional to the ratio of the optical power $P_1$ of the optical signal of the first reflector to the optical power $P_2$ of the optical signal of the second reflector. That is, the at least one of the driving condition of the first reflector or the driving condition of the second reflector may be adjusted based on the ratio of the voltage value of the first electrical signal to the voltage value of the second electrical signal. In addition, another physical quantity of the first electrical signal and the second electrical signal may alternatively be used to adjust a reflectivity of a reflector, provided that the physical quantity can represent an optical power of an optical signal of the reflector.

There may be many specific methods for adjusting the at least one of the driving condition of the first reflector or the driving condition of the second reflector based on the first electrical signal and the second electrical signal. For example, first, a target driving condition of the second reflector may be searched for: the driving condition of the first reflector is fixedly set, the driving condition of the second reflector is changed, $I_1/I_2$ (or $P_1/P_2$) is monitored, and when a value of $I_1/I_2$ reaches a maximum value, the driving condition of the second reflector is the target driving condition of the second reflector; then, a target driving condition of the first reflector is searched for: the driving condition of the second reflector is fixedly set to the target driving condition of the second reflector, the driving condition of the first reflector is changed, $I_1/I_2$ (or $P_1/P_2$) is monitored, and when a value of $I_1/I_2$ reaches a minimum value, the driving condition of the first reflector is the target driving condition of the first reflector. Afterwards, the tunable laser may be set based on the target driving condition of the first reflector and the target driving condition of the second reflector to operate. Certainly, any variation may also be made to the method, provided that adjustment is performed based on the result of comparison between the first electrical signal and the second electrical signal.

For a reflector, especially for a distributed Bragg reflector, a reflectivity of the reflector may be described by using a Gaussian function. For example:

$r_1 = 0.5 * \exp(-x^2)$, where x is a difference between a driving condition (a driving voltage, a driving current, a driving power, or the like) of a first reflector and a desirable driving condition (target driving condition) of the first reflector, and $r_1$ is a reflectivity of the first reflector (herein it is assumed that a highest reflectivity is 0.5).

$r_2 = 0.5 * \exp(-y^2)$, where y is a difference between a driving condition (a driving voltage, a driving current, a driving power, or the like) of a second reflector and a desirable driving condition (target driving condition) of the second reflector, and $r_2$ is a reflectivity of the second reflector (herein it is assumed that a highest reflectivity is 0.5).

The foregoing expressions of $r_1$ and $r_2$ are substituted into a formula $I_1/I_2 = A * P_1/P_2 = A * (1/r_1 - r_1)/(1/r_2 - r_2)$, and a relationship between $I_1/I_2$, and x and y may be obtained. FIG. 7 is a diagram of a relationship between $I_1/I_2$, and x and y. It can be learned that a curved surface is in a saddle camber shape. When x=0 and y=0, $r_1$ and $r_2$ reach maximum values at the same time and $I_1/I_2$ is at an extreme value point (a flattest point) of a saddle camber.

As mentioned in the foregoing, a main problem to be resolved in this patent is to ensure that a reflection peak of a reflector can be aligned with a target wavelength, that is, $r_1$ and $r_2$ reach a maximum at the same time. Therefore, the extreme value point of $I_1/I_2$ is a desirable operating point of the first reflector and the second reflector. During adjustment of the driving condition of the first reflector and the driving condition of the second reflector, a value of $I_1/I_2$ may be used as a feedback, to detect a ratio of a light output power of the first reflector to a light output power of the second reflector, determine whether the reflectivity of the first reflector and the reflectivity of the second reflector are desirable, and perform closed-loop adjustment on the reflectivity of the first reflector and the reflectivity of the second reflector.

It is assumed that $\varepsilon(x,y)=I_1/I_2$, where x is the driving power of the first reflector and y is the driving power of the second reflector. A power may be expressed by using a polynomial of a current, and therefore x or y may also be expressed by using the driving current of the first reflector or the second reflector.

A difference Error Signal of $\varepsilon(x,y)$ and a desirable operating point may be expressed as: $f(x,y)=A*(d\varepsilon/dx)^2+B*(d\varepsilon/dy)^2+C$, where constant coefficients A and B have a same sign, that is, are positive at the same time or negative at the same time, and C is also a constant coefficient. Specific values of A, B, and C are determined based on an actual test result of a laser. When the laser is at the desirable operating point, $d\varepsilon/dx=0$ and $d\varepsilon/dy=0$; a differential term $df/dx=0$ and a differential term $df/dy$ is also 0; the constant coefficient C may be 0; and therefore $f(x,y)=0$.

Strictly, the laser can be considered to operate at the desirable operating point only when $f(x,y)$ is 0. However, in actual operating, when $f(x,y)$ is very close to 0 ($-D<f(x,y)<D$, where D is a very small positive number), it may be considered that the laser is at the desirable operating point. An absolute value (namely, D) of a difference between the Error Signal $f(x,y)$ and 0 may be determined based on an actual test result of the laser. A specific determining criterion is that, when $f(x,y)=D$, negative impact on performance of the laser can be ignored.

In actual processing, a differential at a data point may be approximated by slopes several adjacent data points. If a data point is at an extreme value point, it also means that a slope between the point and a surrounding data point is the smallest (which is theoretically 0), or a difference between the data point and a surrounding data point is the smallest.

A specific method for adjusting the at least one of the driving condition of the first reflector or the driving condition of the second reflector based on the first electrical signal and the second electrical signal may be a method for finding an extreme value point of $I_1/I_2$. A plurality of mathematical methods such as a "hill climbing method" and a "cross coordinate method" may be used to determine whether $I_1/I_2$ is the extreme value point. The following describes a method for finding an extreme value point in detail:

An operating point (x,y) is used as a center, and in this case, a ratio $\varepsilon(x,y)$ of a current value of the first electrical signal to a current value of the second electrical signal is recorded as $\varepsilon_0$. Eight slight offset ($\delta_1$ in an x direction and $\delta_2$ in a y direction) points are set, for example, $(x+\delta_1, y)$, $(x-\delta_1, y)$, $(x, y+\delta_2)$, $(x, y-\delta_2)$, $(x, y-\delta_2)$, $(x+\delta_1, y-\delta_2)$, $(x+\delta_1, y+\delta_2)$, $(x-\delta_1, y-\delta_2)$, and $(x-\delta_1, y+\delta_2)$. Ratios of current values of the first electrical signal to current values of the second electrical signal at the eight points are respectively recorded as $\varepsilon_1, \varepsilon_2, \ldots$, and $\varepsilon_8$. A sum of absolute values of differences between the central point $\varepsilon_0$ and the eight surrounding points (a sum of squares of absolute values, an average number of absolute values of differences, or the like) is calculated as $f(x,y)$, namely, $f(x,y)=(\varepsilon_0-\varepsilon_1)^2+(\varepsilon_0-\varepsilon_2)^2+(\varepsilon_0-\varepsilon_3)^2+\ldots+(\varepsilon_0-\varepsilon_8)^2$.

Then, a point (x2,y2) that has a particular offset from the operating point (x,y) is used, and similar to the operating point (x,y), f(x2,y2) of the point (x2,y2) is calculated. If $f(x,y)>f(x2,y2)$, it indicates that the operating point (x2,y2) is closer to a desirable operating point than the operating point (x,y).

A next operating point closer to the desirable operating point is selected based on an offset between (x2,y2) and (x,y). Whether a smaller f is obtained is determined based on an actual result. The foregoing is repeated until an operating point corresponding to a smallest value of f, namely, the desirable operating point, is found.

A difference $P_1-P_2$ between an optical power $P_1$ of the first reflector and an optical power $P_2$ of the second reflector has a relationship with a reflectivity. Based on a laser beam principle, for a tunable laser, the difference $P_1-P_2$ between the optical power $P_1$ of the first reflector and the optical power $P_2$ of the second reflector is $(t_1^2*r_2-t_2^2*r_1)/(t_1^2*r_2+t_2^2*r_1)$, where $r_1$ is a reflectivity of an end face of a reflector 1, $t_1$ is a transmittance of the end face of the reflector 1, $r_2$ is a reflectivity of an end face of a reflector 2, and $t_2$ is a transmittance of the end face of the reflector 2. For a thermally-tuned tunable laser, the foregoing formula may be properly simplified as follows: A reflector does not have an absorption loss, and then: $t_1^2+r_1^2=1$, and $t_2^2+r_2^2=1$. In this way, $P_1-P_2$ may be simplified to $1-2/(1+(1/r_1-r_1)/(1/r_2-r_2))$. $r_1$ and $r_2$ are both greater than 0 and less than 1. Therefore, when $r_1$ is fixed and $r_2$ is changed, a value of $P_1-P_2$ may reach a maximum value as $r_2$ increases; when $r_2$ is fixed and $r_1$ is changed, a value of $P_1-P_2$ may reach a minimum value as $r_1$ increases. Changing processes of $r_1$ and $r_2$ are processes of adjusting a reflector. If both the first reflector and the second reflector are aligned with a target wavelength, $r_1$ and $r_2$ reach maximum values at the same time. A method similar to the foregoing adjustment method may be used to adjust a driving condition of a reflector.

Similar to the ratio mentioned above, a diagram of a relationship between a difference $I_1-I_2$ between the current value $I_1$ of the first electrical signal and the current value $I_2$ of the second electrical signal, and x and y is also a curved surface presented in a saddle camber shape. When x=0 and y=0, $r_1$ and $r_2$ reach maximum values at the same time and $I_1-I_2$ is at an extreme value point (a flattest point) of a saddle camber.

Therefore, a specific method for adjusting the at least one of the driving condition of the first reflector or the driving condition of the second reflector based on the first electrical signal and the second electrical signal may be a method for finding an extreme value point of $I_1-I_2$. A plurality of mathematical methods such as a "hill climbing method" and a "coordinate method" may be used to determine whether $I_1-I_2$ is the extreme value point.

A person of ordinary skill in the art may be aware that, the units and algorithm steps in the examples described with reference to the embodiments disclosed in this specification may be implemented by electronic hardware, computer software, or a combination thereof. To clearly describe the interchangeability between the hardware and the software, the foregoing has generally described compositions and steps of each example based on functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

In the several embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be indirect couplings or communication connections through some interfaces, apparatuses or units, or may be electrical connections, mechanical connections, or connections in other forms.

The units described as separate parts may or may not be physically separate, and parts displayed as units may or may not be physical units, may be located in one position, or may be distributed on a plurality of network units. A part or all of the units may be selected based on actual needs to achieve the objectives of the solutions of the embodiments of the present invention.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present invention essentially, or the part contributing to the prior art, or all or a part of the technical solutions may be implemented in the form of a software product. The computer software product is stored in a storage medium and includes several instructions for instructing a computer device (which may be a personal computer, a server, a network device, or the like) to perform all or a part of the steps of the methods described in the embodiments of the present invention. The foregoing storage medium includes: any medium that can store program code, such as a USB flash drive, a removable hard disk, a read-only memory (ROM), a random access memory (RAM), a magnetic disk, or an optical disc.

The foregoing descriptions are merely specific implementations of the present invention, but are not intended to limit the protection scope of the present invention. Any modification or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A tunable laser, comprising a first reflector, a second reflector, a phase adjustment area, a gain area, a first detector, a second detector, and a controller, wherein
the phase adjustment area is located between the first reflector and the gain area, the gain area is located between the phase adjustment area and the second reflector, a reflectivity of the first reflector is adjustable, and a reflectivity of the second reflector is adjustable;
the first reflector comprises a first heating layer configured to change a reflection peak wavelength of the first reflector;
the second reflector comprises a second heating layer configured to change a reflection peak wavelength of the second reflector;
the first detector is configured to convert a first optical signal of the first reflector into a first electrical signal;
the second detector is configured to convert a second optical signal of the second reflector into a second electrical signal; and
the controller is configured to adjust at least one of the reflectivity of the first reflector or the reflectivity of the second reflector based on the first electrical signal and the second electrical signal.

2. The tunable laser according to claim 1, wherein the controller is configured to adjust the at least one of the reflectivity of the first reflector or the reflectivity of the second reflector based on a result of comparison between the first electrical signal and the second electrical signal.

3. The tunable laser according to claim 2, wherein the controller is configured to adjust the at least one of the reflectivity of the first reflector or the reflectivity of the second reflector based on a ratio of a current value of the first electrical signal to a current value of the second electrical signal.

4. The tunable laser according to claim 2, wherein the controller is configured to adjust the at least one of the reflectivity of the first reflector or the reflectivity of the second reflector based on a ratio of a voltage value of the first electrical signal to a voltage value of the second electrical signal.

5. The tunable laser according to claim 1, wherein the controller is further configured to control at least one of a phase of the phase adjustment area or a gain of the gain area.

6. The tunable laser according to claim 1, wherein the tunable laser is a tunable semiconductor laser, and the first reflector comprises:
an N-type doped semiconductor material layer;
an intrinsic doped semiconductor material layer, located on the N-type doped semiconductor material layer; and
a P-type doped semiconductor material layer, located on the intrinsic doped semiconductor material layer.

7. The tunable laser according to claim 6, wherein the intrinsic doped semiconductor material layer comprises a waveguide, and the P-type doped semiconductor material layer comprises a grating structure.

8. The tunable laser according to claim 1, wherein the first detector comprises:
an N-type doped semiconductor material layer;
an intrinsic doped semiconductor material layer, located on the N-type doped semiconductor material layer;
a P-type doped semiconductor material layer, located on the intrinsic doped semiconductor material layer; and
a metal layer, located on the P-type doped semiconductor material layer, wherein the first detector converts an optical signal of the intrinsic doped semiconductor material layer into the first electrical signal of the metal layer.

9. The tunable laser according to claim 8, wherein the first reflector and the first detector share a same N-type doped semiconductor material layer, a same intrinsic doped semiconductor material layer, and a same P-type doped semiconductor material layer.

10. The tunable laser according to claim 9, wherein the first reflector further comprises an insulation medium layer, the insulation medium layer is located on the metal layer, the first heating layer is located on the insulation medium layer.

11. The tunable laser according to claim 1, wherein a first optical splitter is located between the first detector and the first reflector.

12. The tunable laser according to claim 1, wherein a first optical interface is further included at an end that is distal from the gain area and on the first reflector.

13. The tunable laser according to claim 12, wherein an amplifier is disposed between the first reflector and the first optical interface to amplify an optical signal that is output from the first reflector.

14. A control method for controlling a tunable laser, wherein the tunable laser comprises a first reflector, a second reflector, a phase adjustment area, a gain area, a first detector, a second detector, and a controller, the first reflector comprises a first heating layer configured to change a reflection peak wavelength of the first reflector, the second reflector comprises a second heating layer configured to change a reflection peak wavelength of the second reflector, the method comprising:

setting a driving condition of the first reflector and a driving condition of the second reflector based on a target wavelength, wherein the driving condition of the first reflector is associated with a reflectivity of the first reflector, and the driving condition of the second reflector is associated with a reflectivity of the second reflector;

converting an optical signal of the first reflector into a first electrical signal, and converting an optical signal of the second reflector into a second electrical signal; and adjusting at least one of the driving condition of the first reflector or the driving condition of the second reflector based on the first electrical signal and the second electrical signal.

15. The method according to claim 14, wherein the adjusting at least one of the driving condition of the first reflector or the driving condition of the second reflector based on the first electrical signal and the second electrical signal comprises: adjusting the at least one of the driving condition of the first reflector or the driving condition of the second reflector based on a result of comparison between the first electrical signal and the second electrical signal.

16. The method according to claim 15, wherein the adjusting the at least one of the driving condition of the first reflector or the driving condition of the second reflector based on the result of comparison between the first electrical signal and the second electrical signal comprises: adjusting the at least one of the driving condition of the first reflector or the driving condition of the second reflector based on a ratio of a current value of the first electrical signal to a current value of the second electrical signal.

17. The method according to claim 15, wherein the adjusting the at least one of the driving condition of the first reflector or the driving condition of the second reflector based on the result of comparison between the first electrical signal and the second electrical signal specifically comprises: adjusting the at least one of the driving condition of the first reflector or the driving condition of the second reflector based on a ratio of a voltage value of the first electrical signal to a voltage value of the second electrical signal.

18. The method according to claim 14, further comprising:

setting a gain and a phase of the tunable laser based on the target wavelength.

* * * * *